(12) United States Patent
Pilgrim et al.

(10) Patent No.: US 6,914,917 B2
(45) Date of Patent: Jul. 5, 2005

(54) DISCRETE WAVELENGTH-LOCKED EXTERNAL CAVITY LASER

(75) Inventors: Jeffrey S. Pilgrim, Santa Fe, NM (US); Joel A. Silver, Santa Fe, NM (US)

(73) Assignee: Southwest Sciences Incorporated, Santa Fe, NM (US)

( * ) Notice: Subject to any disclaimer, the term of this patent is extended or adjusted under 35 U.S.C. 154(b) by 169 days.

(21) Appl. No.: 10/339,587

(22) Filed: Jan. 8, 2003

(65) Prior Publication Data

US 2003/0179789 A1 Sep. 25, 2003

Related U.S. Application Data

(63) Continuation-in-part of application No. 09/912,817, filed on Jul. 24, 2001, now Pat. No. 6,683,895.
(60) Provisional application No. 60/347,158, filed on Jan. 8, 2002.

(51) Int. Cl.[7] .............................. H01S 3/10; H01S 5/00; H01S 3/08
(52) U.S. Cl. .............................. 372/20; 372/23; 372/43; 372/49; 372/102
(58) Field of Search ............................... 372/20, 9, 15, 372/18, 19, 23, 43, 49, 102

(56) References Cited

U.S. PATENT DOCUMENTS

| | | |
|---|---|---|
| 5,319,668 A | 6/1994 | Luecke |
| 5,428,635 A | 6/1995 | Zhiglinsky et al. |
| 5,771,252 A | 6/1998 | Lang et al. |
| 5,995,521 A | 11/1999 | Moore et al. |
| 6,040,914 A | 3/2000 | Bortz et al. |
| 6,118,803 A | 9/2000 | Sanders et al. |
| 6,188,705 B1 | 2/2001 | Krainak et al. |
| 6,282,213 B1 * | 8/2001 | Gutin et al. ................... 372/20 |
| 6,614,829 B1 * | 9/2003 | Tuganov et al. ............ 372/107 |
| 2001/0036206 A1 * | 11/2001 | Jerman et al. ................ 372/20 |
| 2002/0154662 A1 | 10/2002 | Turpin et al. |

OTHER PUBLICATIONS

Harvey, K.C., et al., "External–Cavity Diode Laser Using a Grazing–Incidence Diffraction Grating," *Optics Letters*, vol. 16, No. 12, pp. 910–912 (Jun. 15, 1991).

Littman, M.G., et al., "Spectrally Narrow Pulsed Dye Laser Without Beam Expander," *Applied Optics*, vol. 17, No. 14, pp 2224–2227 (Jul. 15, 1978).

Oh, D.B., et al., "Wavelength–Modulation Detection of Acetylene with a Near–Infrared External–Cavity Diode Laser," *Applied Optics*, vol. 34, No. 30, pp 7002–7005 (Oct. 20, 1995).

* cited by examiner

*Primary Examiner*—Minsun Oh Harvey
*Assistant Examiner*—Armando Rodriguez
(74) *Attorney, Agent, or Firm*—Peacock Myers & Adams; Jeffery D. Myers

(57) ABSTRACT

An external cavity laser (and method of generating laser light) comprising: a laser light source; means for collimating light output by the laser light source; a diffraction grating receiving collimated light; a cavity feedback mirror reflecting light received from the diffraction grating back to the diffraction grating; and means for reliably tuning the external cavity laser to discrete wavelengths.

20 Claims, 5 Drawing Sheets

US 6,914,917 B2

DISCRETE WAVELENGTH-LOCKED EXTERNAL CAVITY LASER

CROSS-REFERENCE TO RELATED APPLICATIONS

This application is a continuation-in-part application of U.S. patent application Ser. No. 09/912,817, entitled "Wavelength Agile External Cavity Diode Laser", filed on Jul. 24, 2001 now U.S. Pat. No. 6,683,895, and the specification thereof is incorporated herein by reference.

This application also claims the benefit of the filing of U.S. Provisional Patent Application Ser. No. 60/347,158, entitled "Discrete-Wavelength Locked External Cavity Laser", filed on Jan. 8, 2002, and the specification thereof is incorporated herein by reference.

GOVERNMENT RIGHTS

This invention was made with government support under NAS3-01007 awarded by NASA Glenn Research Center and DMI-0215022 awarded by the National Science Foundation. The Government has certain rights in the invention.

BACKGROUND OF THE INVENTION

1. Field of the Invention (Technical Field)

The following description relates to the field of optical telecommunications using tunable external cavity diode lasers. The ability of this invention to operate at discrete wavelengths corresponding to optical telecommunication channels without add-in optical components greatly improves the utility of the device while providing substantial cost savings.

2. Background Art

Diode lasers have become enabling technology for fiber optic networks (telecommunications) because of their cost, compactness, and spectral properties. External cavity lasers (ECLs) based around diode laser gain elements are further enhancing capability in these applications by virtue of their excellent spectral properties with significantly increased wavelength tuning ranges. It is essential to exploit the increased spectral coverage of ECLs while simultaneously insuring that they operate only at precisely defined communication channels (wavelengths). This requirement is typically accomplished by the incorporation of add-in optical components that 'lock' the ECL output wavelength to these specifically allowed channels. Such add-in components contribute substantially increased cost to the ECL source laser. Furthermore, the optical alignment of these components to achieve the required wavelength precision is nontrivial and may incur substantial production costs. In the worst case, the optical alignment of these add-in components would require human interaction. The present invention relies on extant features of already-included ECL components, slightly modified, to provide their normal functions while simultaneously providing the required discrete wavelength locking. Thus, add-in optical components and their associated alignment requirements are eliminated.

SUMMARY OF THE INVENTION (DISCLOSURE OF THE INVENTION)

The present invention is of an external cavity laser (and method of generating laser light) comprising (the employment of): a laser light source; means for collimating light output by the laser light source; a diffraction grating receiving collimated light; a cavity feedback mirror reflecting light received from the diffraction grating back to the diffraction grating; and means for reliably tuning the external cavity laser to discrete wavelengths. In the preferred embodiment, the laser light source comprises a Fabry-Perot diode laser, preferably with no anti-reflection coating or an anti-reflection coating that does not suppress the diode laser's Fabry-Perot modes. The tuning means comprises means for selecting a particular Fabry-Perot mode of the diode laser for the external cavity laser output and preferably means for locking a discrete wavelength to which the external cavity laser is tuned to a Fabry-Perot mode of the diode laser. Means for determining whether the external cavity laser is operating in a single frequency output mode is preferably employed. The locking and determining means employ one or more of laser output power, laser compliance voltage, laser compliance current, laser polarization extinction ratio, and laser side mode suppression ratio. The tuning means may comprise a plurality of cavity feedback mirrors in an array, the spatial location of that mirror in angular feedback condition with respect to the diffraction grating determining a discrete wavelength to which the external cavity laser is tuned. The array is preferably one-dimensional, with mirrors not in angular feedback condition tilted away from normal incidence with respect to the diffraction grating, and comprising micro-electro-mechanical systems. A preferred embodiment for telecommunications applications allows tuning of the external cavity laser to discrete wavelengths which correspond to wavelengths of an ITU-T grid.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED
EMBODIMENTS (BEST MODES FOR
CARRYING OUT THE INVENTION)

Figure 1:
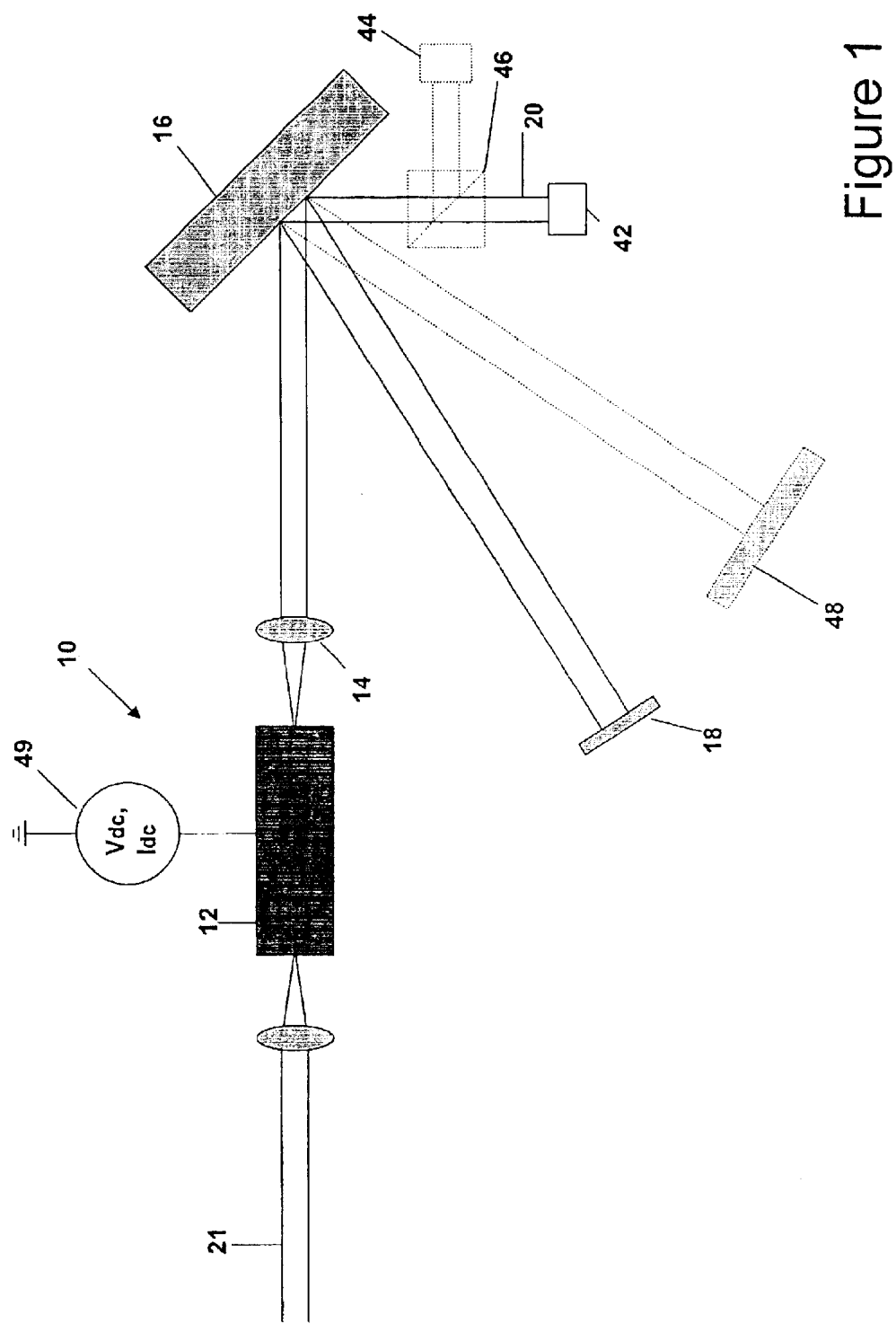
FIG. 1 is a schematic drawing of the components that constitute the ECL invention 10. The schematic is based on the Littman-Metcalf design as modified by Harvey and Myatt (K. C. Harvey and C. J. Myatt, Opt. Lett. 16, 910 (1991)). However, a Fabry-Perot diode laser 12 is used as the gain element with either no anti-reflection coating applied or with an anti-reflection coating that is not sufficient to suppress the diode's Fabry-Perot modes. The laser diode output is collimated with a lens 14 and directed to a diffraction grating 16 where wavelength selection occurs. The diffracted beam is retro-reflected from the cavity feedback mirror 18 to complete the laser resonator. ECL output 20 provides means for monitoring ECL output power with detector 42 and polarization extinction ratio (polarization selective optic 46 and detector 44 shown in phantom). ECL output 21 is shown for collecting the ECL output for use in a fiber optic network. It should be appreciated that output 20 may be used for collection and use in a fiber optic network and output 21 may be used for wavelength locking. Optional position sensitive detector 48 is shown in phantom. Voltage/current meter 49 is shown for optionally monitoring the diode laser compliance voltage or compliance current. Various combinations of outputs and locations of elements situated for discrete wavelength locking may be employed as understood by one of skill in the art.

A preferred embodiment of the present invention is based on the Littman-Metcalf design as modified by Harvey and Myatt. However, rather than suppress the intrinsic Fabry-Perot modes of the diode gain element, the invention preserves those modes. Furthermore, the invention exploits the wavelength selectivity provided by those modes to 'lock' the output wavelength to a given telecommunication channel grid. The first embodiment is shown schematically in FIG. 1. Several options are given for extracting useful output power from the device for use in a telecommunication network. These possibilities for obtaining ECL output are well-known in the art and do not constrain the invention. The invention described herein is equally applicable to various mechanisms for providing the required external feedback and for obtaining useful laser output. In the embodiment of FIG. 1, output 21 is shown as the usable output for direction into the fiber optic network. Optional output 20 is shown for monitoring the laser output power either with or without polarization selectivity provided by the polarization selective element. The second detector monitors power in an orthogonal polarization state relative to the main power detector. In addition, a position sensitive detector is shown monitoring the zeroeth order reflection from the retro-reflected beam from the feedback mirror. Because, this reflex has been diffracted once on its path to the feedback mirror, it is dispersed. That is, there is a spatial dependence on wavelength. When the feedback mirror is rotated to selected a new discrete output wavelength for the ECL, this beam moves spatially. Thus, a calibrated position sensitive detector, or a linear diode array, intercepting this beam can determine the coarse output wavelength of the ECL. In this case, the diffraction grating is used both as an active wavelength selective element, functioning as part of the laser resonator, and a source of spectrometric dispersion for determining the output wavelength. Voltage/current meter 49 is shown for optionally monitoring the diode laser compliance voltage or compliance current for determining that the ECL is operating with single frequency output and is in the feedback condition.

In a Fabry-Perot laser resonator the optical path length of the resonator determines the possible output wavelengths. The number of half-wavelengths contained within the given optical path length must be an integer. The invention relies on a precisely controlled length of the Fabry-Perot resonator (the diode laser gain element) such that the mode spacing is equivalent to the channel spacing of the dense wavelength division multiplexing (DWDM) telecommunication channel grid, or integer multiples or fractions thereof. Of course, the resonator length precision required to be within error tolerances for a given channel grid depends on exactly what those error tolerances are. Nonetheless, the required precision need not be arbitrarily high. One need only ensure operation within tolerances over the wavelength range in which the ECL is designed to operate. As an example, the present International Telecommunications Union Telecommunications Standardization Sector ("ITU-T") DWDM grid with 50 GHz channel spacing can typically allow an error of +/−3 GHz away from the grid channel center. The present invention will provide this level of precision if the resonator chip length can be produced with an error of less than a few parts per thousand and the laser temperature is allowed to change within reasonable limits to compensate for length error. Reasonable limits are those that allow sufficient output power for the application and meet lifetime specifications for the device.

The diode laser gain element Fabry-Perot modes provide the primary wavelength selection. The ECL built around this gain element selects which of these Fabry-Perot modes is allowed to oscillate. The ECL further suppresses operation on any adjacent gain element Fabry-Perot modes. However, in order to provide wavelength tuning, the ECL must be in control of the output wavelength. That is, in the absence of the ECL, the diode laser alone would select one or a few Fabry-Perot modes on which to oscillate and that selection would not be controlled. Thus, there must be a feedback mechanism in place to indicate when the ECL is in control of the output wavelength. When the ECL is in control of the wavelength, the laser has single-frequency output. There are, however, conditions where the ECL feedback mirror is midway between selecting two adjacent Fabry-Perot modes. In this condition, the laser output is multi-mode (the output may become dominated by the bare diode laser). Therefore, the required feedback locking mechanism is equivalent to determining if the ECL is operating single frequency together with information concerning the angular position of the feedback mirror.

There are several feedback mechanisms that have been determined to indicate single frequency operation and are hereby incorporated into the present invention. 1) The laser output power is affected by the ECL feedback condition. 2) The voltage drop at constant current across the diode laser gain element is affected by the ECL feedback condition (or conversely, the supplied current at constant voltage is affected). 3) A third potential feedback mechanism exists based on the polarization extinction ratio of the ECL output beam. The presence of optical feedback from the external cavity may affect the relative magnitude of output power into two orthogonal polarization states. One may then, with a polarization selective filter, determine that the power in one or both of the polarizations has changed, thereby establishing that the ECL is in control of the laser output.

Relative to multi-mode operation, the laser output power changes when the ECL is in an optical feedback condition such that the laser output is single frequency. Depending on the characteristics of the particular gain element employed, the laser output power may either increase or decrease upon conversion to single frequency operation. Furthermore, the direction of the change of the ECL output power may depend on what part of the gain curve of the diode element the ECL is forcing operation. For example, at the peak of the gain curve, the power may increase when the ECL feedback provides single frequency operation. However, for the same gain element, the output power may decrease when the ECL forces single frequency operation significantly displaced in wavelength from the peak of the gain curve. Nevertheless, single frequency operation is accompanied by a change in the laser output power, relative to multi-mode power. This feedback mechanism when coupled with the precisely determined angular position of the feedback mirror determines that the ECL is operating single frequency at a particular diode gain element Fabry-Perot mode. Various methods for determining the precise angular position of the feedback mirror are known in the art. An example is a micro-electromechanical system (MEMS) mirror where the precise angular position is set with a control voltage.

Figure 2:
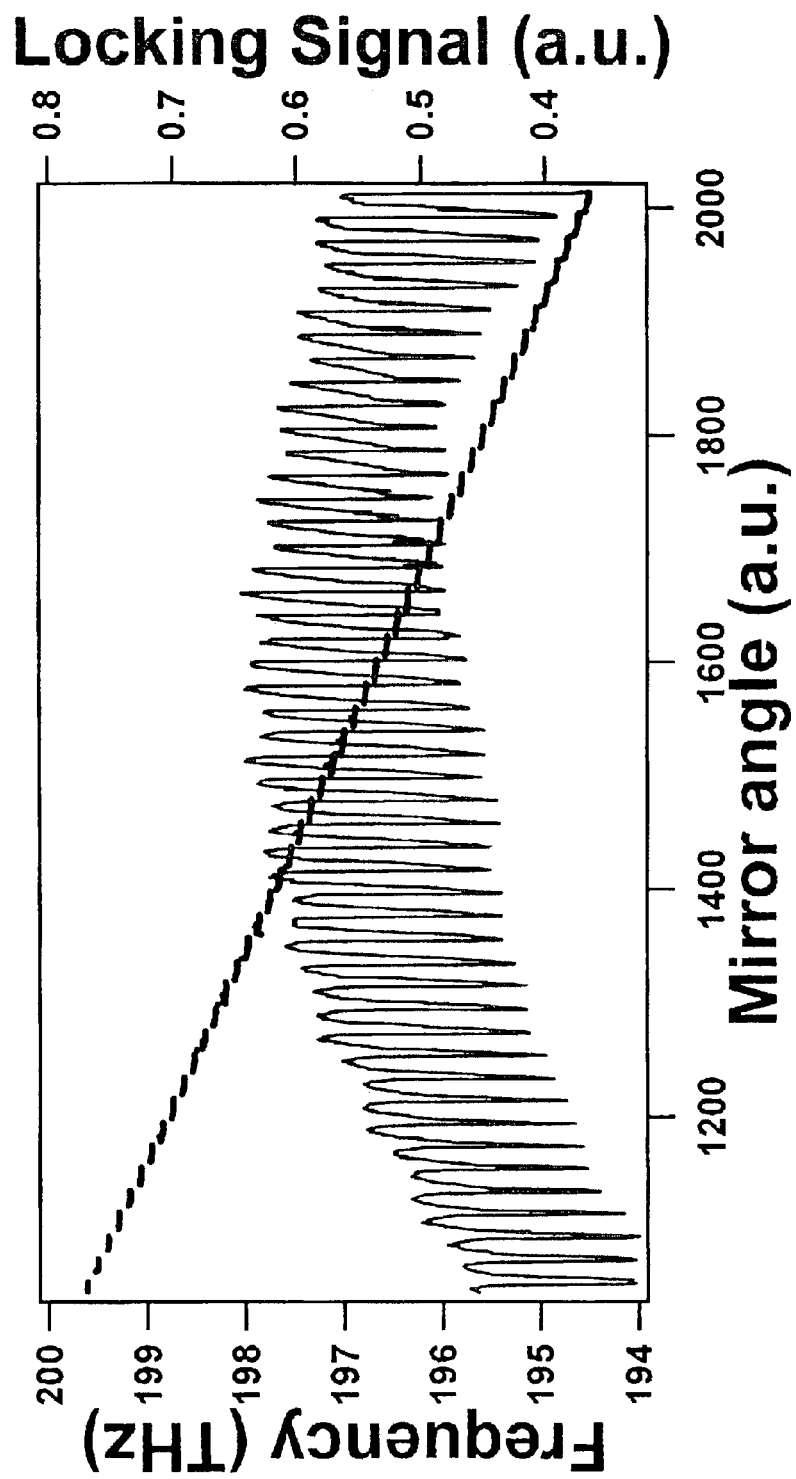
FIG. 2 presents an example of the wavelength locking mechanism based on the ECL output power. The variation in the feedback locking signal is shown as the ECL is tuned by a simple rotation of the feedback mirror angle over 48 Fabry-Perot modes of the diode laser gain element. A laboratory measurement of the wavelength obtained simultaneously with the feedback locking signal shows how that signal corresponds to single frequency operation on a particular Fabry-Perot mode.

FIG. 2 shows locking feedback signal based on the ECL output power mechanism as the ECL is tuned through 48 Fabry-Perot modes (channels) of the diode gain element. A more detailed laboratory measurement is simultaneously obtained by using a scanning Michelson interferometer to precisely determine the ECL wavelength during the scan. The ability of the Michelson interferometer to obtain a high-precision reading is a de facto indicator of single mode operation. Note the discontinuities in the Michelson interferometer reading (labeled Frequency (THz)) when the ECL switches Fabry-Perot modes, hence the discrete locking and tuning. Note further that the peaks of the feedback locking signal correspond to the center, or near center, of the mirror angle scan for any particular Fabry-Perot mode. Thus, when the feedback locking signal is at a local maximum, it is clear the ECL is both operating single frequency and at or near the peak of the selected Fabry-Perot mode. This is all that is required for precisely locking the ECL output wavelength.

An alternative, or complementary, feedback mechanism is provided electronically by the measured voltage across the diode gain element at constant current. When the ECL goes from multi-mode to single frequency, the voltage across the gain element changes. Similar to the laser output power, the voltage may either increase or decrease upon conversion to single frequency operation. Additionally, a change in polarization extinction ratio is anticipated to accompany conversion from multi-mode to single frequency operation influenced by the feedback from the external cavity. Further, the laser side mode suppression ratio may change upon conversion from multi-mode to single frequency operation under influence by the feedback from the external cavity.

Thus, providing discrete wavelength locking to the DWDM channel grid is a two step process. First, insure that the Fabry-Perot gain element's allowed wavelengths correspond to the grid within the allowed error. Second, insure that the ECL output is on a particular Fabry-Perot mode.

Figure 3:
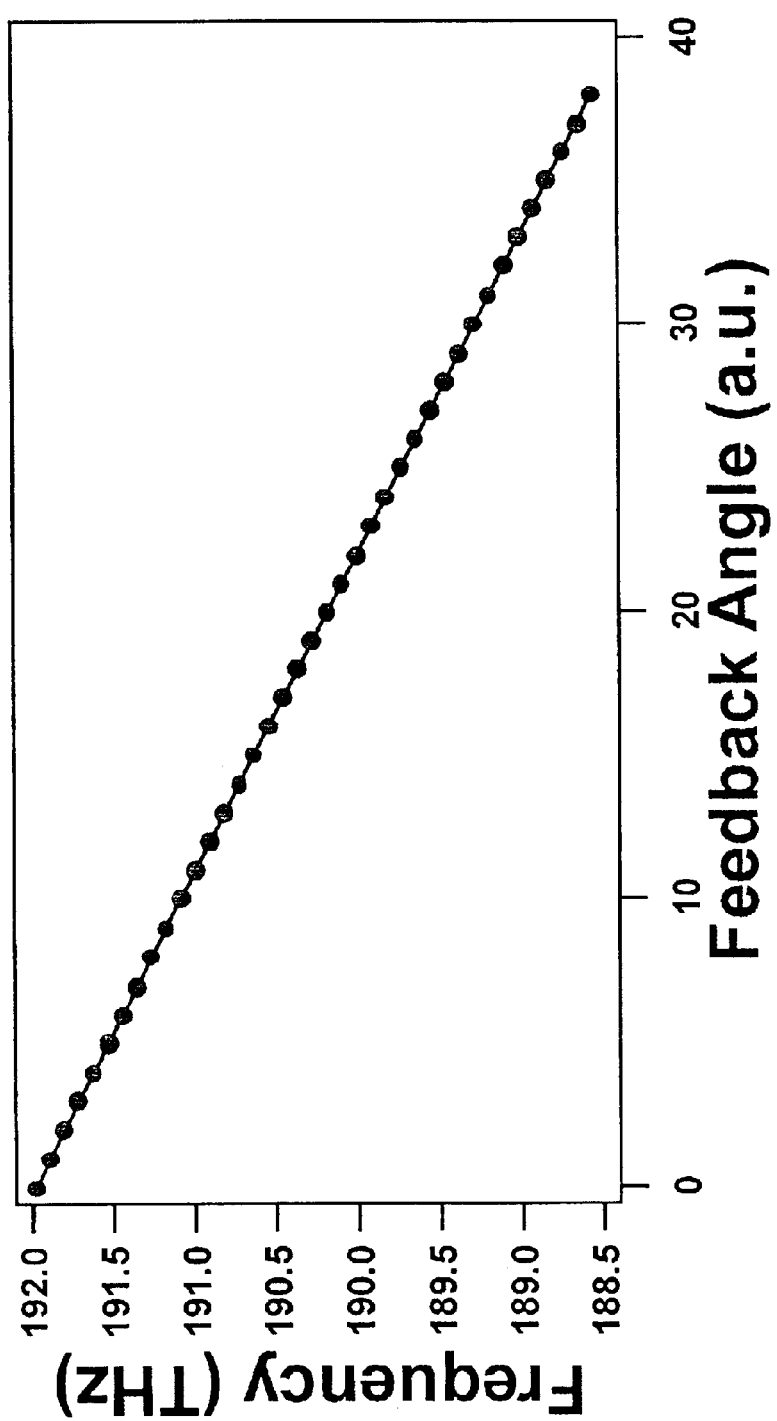
FIG. 3 is a graph showing the wavelength tuning characteristics of the ECL invention operating only at the discrete Fabry-Perot modes corresponding to the optical length of the diode laser gain element. Each data point is a discrete Fabry-Perot mode of the diode laser gain element where the ECL ensures only that wavelength becomes the output of the laser. The laser is tuned from one discrete Fabry-Perot mode to the next by changing the angle of the feedback mirror.

There are several ways to determine that the ECL is operating single frequency on a particular Fabry-Perot mode. If the feedback mirror can be set to sufficient precision, only a single pre-determined Fabry-Perot mode will be able to oscillate with feedback from the ECL. Further indication of single frequency operation by one or more of the mechanisms described previously guarantees that the ECL has selected that pre-determined Fabry-Perot mode. Alternatively, the ECL can be operated continuously while it is scanned from its present known DWDM channel of operation to the desired channel and the number of single frequency feedback indicators can be counted. For example, if the laser in on Channel 20 and it is desired to go to Channel 25, one would count a succession of 5, and only 5, power or voltage feedback indications while adjusting the ECL optical feedback mirror in the required direction. FIG. 3 shows the discrete wavelengths of single-frequency operation available in a laboratory ECL after the design of the present invention. The Fabry-Perot modes of the device used to generate the data of the figure are spaced by 90 GHz.

Figure 4:
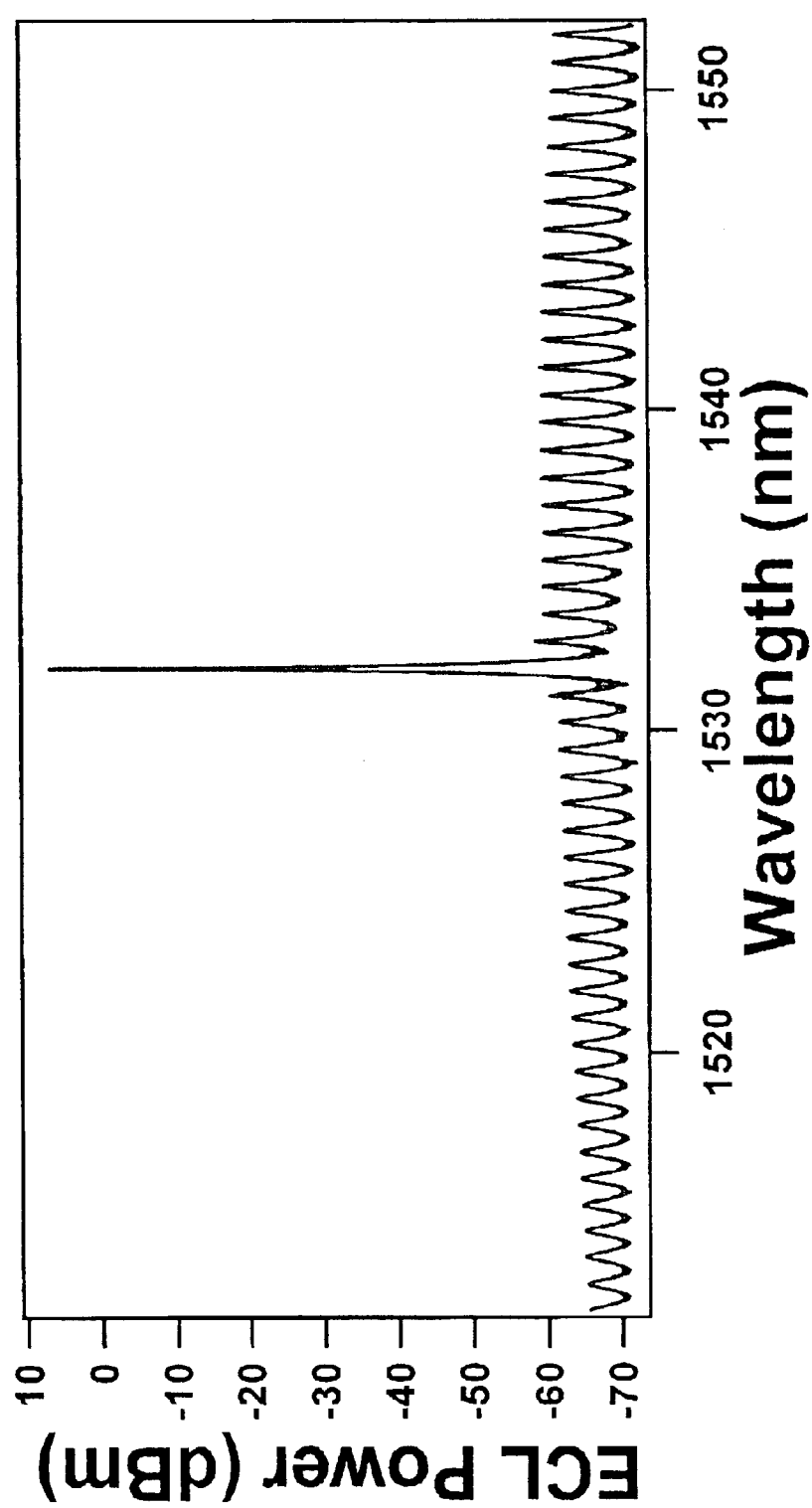
FIG. 4 is an optical spectrum analyzer trace showing the color purity of the ECL output and a typical side mode suppression ratio. The much reduced peaks correspond to suppressed Fabry-Perot modes of the diode gain chip. These are the allowed operating channels of the ECL device.

The idea of Fabry-Perot modes corresponding to telecommunication channels is demonstrated further in FIG. 4. An optical spectrum analyzer (OSA) was used to obtain the output spectrum of an ECL after the design of this preferred embodiment. The dynamic range of an OSA allows measurement of output wavelengths that may be suppressed by more than one million times. The lower intensity peaks on either side of the central peak correspond to available channels determined by the diode gain chip Fabry-Perot modes. One picks which channel is effectively the external cavity laser output by being present at more than one million times the intensity of any other channel by a rotation of the feedback mirror to the appropriate angular position. The laser power of the peak mode to the strongest non-peak mode is the side mode suppression ratio (SMSR). In the case of the device of FIG. 4, the SMSR is over +60 dB. This SMSR is more than sufficient for optical fiber networks. The ECL generating the data of the figure is used for illustration purposes only. The Fabry-Perot modes of the device in this example do not correspond to the ITU-T DWDM grid.

It should be appreciated that, for telecommunication applications, the ECL will not be allowed to emit an undesired channel into the optical communications network when changing from one channel to another. Thus, if the counting channel mechanism is to be employed, some type of optical shutter (not shown), or its equivalent, would be required to block ECL emission during the tuning procedure.

A wholly different mechanism for discrete wavelength locking is included herein as a second embodiment. In this embodiment, the wavelengths are not required to be constrained by the diode laser gain element Fabry-Perot modes, although inclusion of that additional feature will not necessarily affect the utility of the invention. However, it may be preferable to have an antireflection coating on the diode gain element in this embodiment to suppress the device's Fabry-Perot modes. The first embodiment relies on accurately controlling the length of the diode laser gain element. It may be challenging to achieve the required precision in production while keeping costs down. However, lithographic production processes routinely achieve high precision and low cost simultaneously. Thus, it would be advantageous to use the demonstrated precision of lithographic processes to provide the needed ECL wavelength locking. Consequently, the second embodiment relies on a Micro-Electro-Mechanical Systems ("MEMS") based mirror array to select discrete ECL operating wavelengths. MEMS mirrors are produced lithographically in the same type process with which semiconductor integrated circuits are manufactured. MEMS mirrors have been produced with constantly increasing complexity in both linear and two-dimensional arrays.

Because the light incident upon the diffraction grating in the ECL is diffracted in a plane, the diffraction plane, a one-dimensional mirror array can provide the required discrete wavelength selection. The diffracted light is contained within the plane defined by the incident light from the diode laser gain element and the grating normal. Preferably this plane contains either the fast or slow axis of the diode laser emission and further the fast or slow axis contains the plane of polarization of the laser output. In a traditional Littman-Metcalf ECL, the feedback mirror is a single contiguous component. If the feedback mirror angle were changed to select a different wavelength, the feedback beam would be displaced spatially on the mirror. The present invention, instead, uses discrete mirrors that are placed at particular locations in the diffraction plane such that each mirror is capable of selecting a particular discrete wavelength for feedback into the ECL. In order to have the array select a given discrete wavelength only the MEMS mirror corresponding to that wavelength will be allowed to reflect the diffracted beam back upon itself, thereby completing the ECL resonator. The other MEMS mirrors of the array will be rotated so that diffracted light reaching them is not allowed to provide optical feedback; preferably the light is directed out of the diffraction plane.

By selecting which mirror is allowed to establish the feedback condition, one selects the discrete wavelength for output that corresponds to that mirror. Thus, each mirror element of the MEMS array has an inherently digital nature, it either provides optical feedback or not. There are no other allowed states. This is in contrast to other ECL mirror-based optical feedback mechanisms where a single mirror is rotated through a continuous range of feedback angles with each angle selecting a particular wavelength. These other mirror mechanisms, even MEMS based ones, are inherently analog where the mirror has a multitude of allowed states. Furthermore, a single mirror provides only with difficulty the required precision, repeatability, and aging characteristics to function alone as a discrete wavelength locker for DWDM. Any approach using a single mirror will require some type of additional wavelength locking mechanism, including that described herein as the first embodiment. The difference being in the first embodiment that the gain element functions in a dual role including that of wavelength locker.

Figure 5:
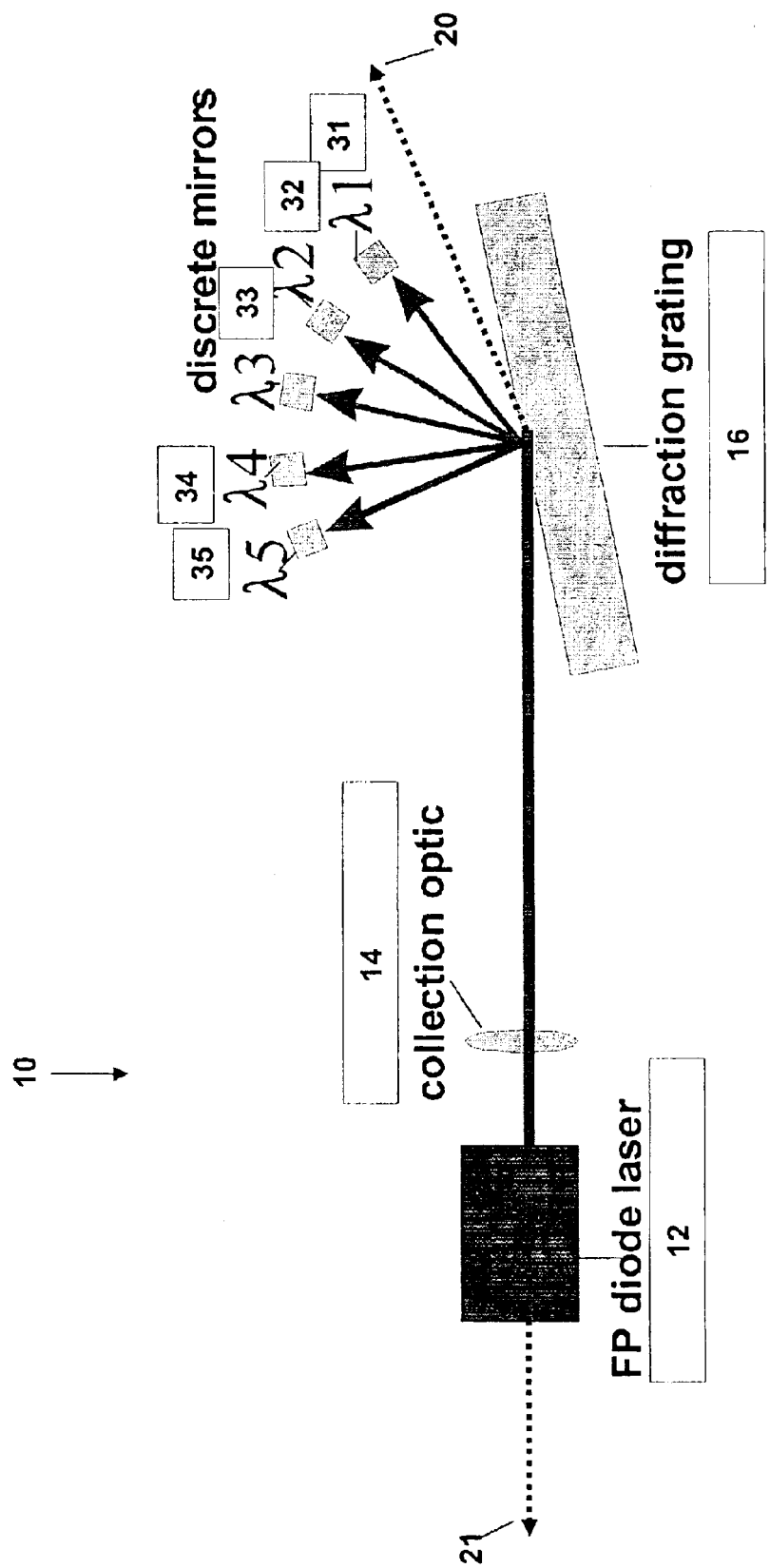
FIG. 5 is a schematic drawing of the ECL invention 10 where the diode laser gain element may or may not have preserved Fabry-Perot modes. The locking mechanism is provided by an array of mirrors 31, 32, 33, 34, 35 where the spatial location of the mirror in an angular feedback condition with respect to a diffraction grating determines what discrete wavelength is allowed from the ECL. The other mirrors are then ensured not to be in a feedback condition by tilting them away from normal incidence.

It should be appreciated that while the MEMS array will be a consecutive series of mirrors, it will not necessarily be linear. This is because the mirrors will not only be displaced from one another spatially but each mirror will also have a slightly different feedback angle with respect to the diffraction grating. There are several means to accomplish this. The normals to the mirror surfaces, preferably located at the center of each mirror, may be made perpendicular to the tangent of a circle at the mirror surface where the circle origin is the point of diffraction of the diffraction grating. All the mirrors may have their surfaces on a circle of like radius or not. The key feature is that each mirror have a different, and precisely defined, angle with respect to the diffraction grating. It should be further appreciated that each mirror will correspond to a particular DWDM telecommunication channel and that a given number of channels will require that number of elements in the MEMS mirror array. The spacing of the mirrors in the array will depend upon the dispersion of the diffracted light and the distance of the array element mirrors from the point of diffraction. It should be appreciated that the optical path length from diffraction grating to mirror array can be substantially increased by use of an optical multiple pass cell, or a folded resonator, without incurring much increase in the physical size of the ECL. The size of an individual mirror will depend on the size of the diffracted beam and the required amount of feedback to establish control of the ECL output wavelength. FIG. 5 shows schematically an example of the second embodiment where the mirror elements are on a circle of like radius. Only five discrete mirrors are shown with their size and spacing exaggerated for clarity.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, and of the corresponding application(s), are hereby incorporated by reference.

What is claimed is:

1. An external cavity laser comprising:
    a laser light source comprising a Fabry-Perot diode laser, wherein said diode laser comprises no anti-reflection coating or an anti-reflection coating that does not suppress said diode laser's Fabry-Perot modes;
    means for collimating light output by said laser light source;
    a diffraction grating receiving collimated light;
    a cavity feedback mirror reflecting light received from said diffraction grating back to said diffraction grating; and
    means for reliably tuning said external cavity laser to discrete wavelengths.

2. The external cavity laser of claim 1 wherein said tuning means comprises means for selecting a particular Fabry-Perot mode of said diode laser for the external cavity laser output.

3. The external cavity laser of claim 2 wherein said tuning means comprises means for locking a discrete wavelength to which said external cavity laser is tuned to a Fabry-Perot mode of said diode laser.

4. The external cavity laser of claim 3 comprising means for determining whether said external cavity laser is operating in a single frequency output mode.

5. The external cavity laser of claim 4 wherein said means for locking a discrete wavelength and determining whether said external cavity laser is operating in a single frequency output mode are selected from one or more of the group consisting of laser output power, laser compliance voltage, laser compliance current, laser polarization extinction ratio, and laser side mode suppression ratio.

6. The external cavity laser of claim 1 wherein said tuning means comprises a plurality of cavity feedback mirrors in an array, a spatial location of that mirror in angular feedback condition with respect to said diffraction grating determining a discrete wavelength to which said external cavity laser is tuned.

7. The external cavity laser of claim 6 wherein said array is one-dimensional.

8. The external cavity laser of claim 6 wherein mirrors not in angular feedback condition are tilted away from normal incidence with respect to said diffraction grating.

9. The external cavity laser of claim 6 wherein said plurality of mirrors comprise micro-electro-mechanical systems.

10. The external cavity laser of claim 1 wherein said means for reliably tuning said external cavity laser to discrete wavelengths comprises means for tuning said external cavity laser to discrete wavelengths which correspond to wavelengths of an ITU-T grid.

11. A method of generating laser light via and external cavity laser, the method comprising:

emitting laser light from a source comprising a Fabry-Perot diode laser, wherein the diode laser comprises no anti-reflection coating or an anti-reflection coating that does not suppress the diode laser's Fabry-Perot modes;

collimating light output by the source;

receiving collimated light with a diffraction grating;

reflecting light received from the diffraction grating back to the diffraction grating with a cavity feedback mirror; and reliably tuning the external cavity laser to discrete wavelengths.

12. The method of claim 11 wherein the tuning step comprises selecting a particular Fabry-Perot mode of the diode laser for the external cavity laser output.

13. The method of claim 12 wherein the tuning step comprises locking a discrete wavelength to which the external cavity laser is tuned to a Fabry-Perot mode of the diode laser.

14. The method of claim 13 additionally comprising determining whether the external cavity laser is operating in a single frequency output mode.

15. The method of claim 14 wherein the locking and determining steps comprise employing one or more means selected from the group consisting of laser output power, laser compliance voltage, laser compliance current, laser polarization extinction ratio, and laser side mode suppression ratio.

16. The method of claim 11 wherein the tuning step comprises employing a plurality of cavity feedback mirrors in an array, a spatial location of that mirror in angular feedback condition with respect to the diffraction grating determining a discrete wavelength to which the external cavity laser is tuned.

17. The method of claim 16 wherein the array is one-dimensional.

18. The method of claim 16 wherein mirrors not in angular feedback condition are tilted away from normal incidence with respect to the diffraction grating.

19. The method of claim 16 wherein the plurality of mirrors comprise micro-electro-mechanical systems.

20. The method of claim 11 wherein tuning comprises tuning the external cavity laser to discrete wavelengths which correspond to wavelengths of an ITU-T grid.

* * * * *